(12) United States Patent
Yamanaka

(10) Patent No.: US 6,928,004 B2
(45) Date of Patent: Aug. 9, 2005

(54) SEMICONDUCTOR MEMORY DEVICE

(75) Inventor: Toshiki Yamanaka, Osaka (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 10/776,481

(22) Filed: Feb. 10, 2004

(65) Prior Publication Data
US 2004/0223360 A1 Nov. 11, 2004

(30) Foreign Application Priority Data
Feb. 14, 2003 (JP) ........................................ 2003-036535

(51) Int. Cl.[7] .............................................. G11C 16/04
(52) U.S. Cl. .................................. 365/189.05; 365/233
(58) Field of Search ........................... 365/189.05, 233, 365/189.01, 189.08

(56) References Cited

U.S. PATENT DOCUMENTS

| 5,369,611 | A | * | 11/1994 | Miura ................... 365/189.05 |
| 5,598,371 | A | * | 1/1997 | Lee et al. .............. 365/189.05 |
| 5,901,091 | A | * | 5/1999 | Lee ....................... 365/189.05 |
| 6,151,257 | A | * | 11/2000 | Jeffrey et al. .......... 365/189.05 |
| 6,580,653 | B2 | | 6/2003 | Yamanaka |
| 6,714,477 | B2 | * | 3/2004 | Nakayama et al. ..... 365/230.03 |

FOREIGN PATENT DOCUMENTS

| JP | 7-211069 | 8/1995 |
| JP | 11-134872 | 5/1999 |
| JP | 2001-167572 | 6/2001 |

* cited by examiner

Primary Examiner—Anh Phung
(74) Attorney, Agent, or Firm—Cooper & Dunham LLP

(57) ABSTRACT

A semiconductor memory device for reducing noise influence is disclosed. The device comprises an input circuit for receiving data to be written into a memory cell array and outputting the received data to write buffer circuits that write the received data into the memory cell array; an output circuit for outputting read data to the outside, each of the read data elements having been read out from the memory cell array and amplified by a corresponding sense amplifier; an input controller for controlling the input circuit so that the input circuit receives the received data only during a predetermined period; a plurality of input data lines for transmitting the received data from the input circuit to the write buffer circuits; and a plurality of output data lines for transmitting the data amplified by the sense amplifiers to the output circuit. Each of the input data lines and each of the output data lines are alternatingly and adjoiningly disposed on the semiconductor memory device.

8 Claims, 10 Drawing Sheets

PRIOR ART

SEMICONDUCTOR MEMORY DEVICE

BACKGROUND OF THE INVENTION

1. Field of the Invention

The present invention generally relates to a semiconductor memory device utilized in a semiconductor integrated circuit, and more specifically relates to layouts of data reading lines in such semiconductor memory devices.

2. Description of the Related Art

In semiconductor memory devices for reading and writing data, generally, when reading out data stored in a memory cell, its small current is amplified by a sense amplifier in order to output the data to the outside.

FIG. 12 is a schematic block diagram of an example of conventional semiconductor memory device. Only one input terminal DI and one output terminal DO are shown in FIG. 12 for simplicity.

In FIG. 12, data read out from a memory cell array 101 are inputted via a bit line pair BL and a data line pair CL to a sense amplifier 103.

The sense amplifier 103 detects a very small potential difference on the bit line pair BL and amplifies it. A data element outputted from the sense amplifier 103 passes through a selection gate 104 comprising an NMOS transistor and is latched in a latch circuit 105. The latch circuit 105 holds the data even after the operation completion of the sense amplifier 103. The data latched in the latch circuit 105 are outputted by an output buffer 106 to the outside at an output terminal DO. During a writing operation, based on an input data element inputted at an input terminal DI to an input circuit 107, a write buffer 108 drives the bit line pair BL having a large load capacity, and writes the data element into a selected memory cell in the memory sell array 101.

FIG. 13 is a schematic block diagram of another example of a conventional semiconductor memory device. In the semiconductor memory device shown in FIG. 13, data provided from a desired selection gate among a plurality of selection gates are outputted to the outside through an output terminal DO. Parts shown in FIG. 13 the same as or similar to parts shown in FIG. 12 are assigned the same reference numbers as those in FIG. 12. The semiconductor memory device shown in FIG. 13 is normally used when separating a large capacity memory cell array 101 into several blocks.

In the semiconductor memory device shown

FIG. 13, similar to the device shown FIG. 12, sense amplifiers SA0~SAn detect a very small potential difference on bit line pairs BL and amplify it. One of the data elements outputted from the sense amplifiers SA0~SAn is selected by selection gates SG0~SGn, and latched in a latch circuit 105. The latched data element is the one of the selected block among a plurality of blocks having the plurality of sense amplifiers.

In the actual circuit layouts of the semiconductor memory devices shown in FIGS. 12 and 13, circuits within and outside of the memory cell array 101 have to be dense in order to reduce cell sizes. There are many varieties of signal lines laid adjacent to the output data line IDO. For example, FIG. 14 shows an example layout of such data lines. An input data line IDI for writing data and an internal control signal line CKL for transmitting an internal synchronization signal ICK are laid adjacent to an output data line IDO for reading out data. The internal synchronization signal ICK controls the whole internal circuit in the semiconductor memory device. In another example, the output data line IDO is laid adjacent to wirings between a column gate 102 and sense amplifiers.

In such dense layouts, surrounding signals create a bad effect as noise. Especially, the output data line IDO is an important bus determining the operation speed, but it has a problem in that it is intolerant of noise. For example, the bit line pair BL transmits a very small electric current, and therefore is easily affected by noise generated by surrounding circuit operations. As a result, data output from the sense amplifiers may become incorrect.

In a case where data speed is prioritized in a fast memory and the like, a latch circuit 105 has weak data holding ability. If noise occurs during the holding period of the latch circuit 105, the output data line IDO is easily affected by the noise, and the data stored in the latch circuit 105 may be inverted. And if noise invades the output data line IDO, it erroneously drives the large output buffer 106 and may induce further power supply noise.

Japanese Patent Laid-Open Publication 11-134872 discloses one scheme regarding signal line layout for reducing cross talk noise where output data badly affect an external signal line. In the layout, the external signal line is disposed between one signal line for transmitting non-inverted output data and another signal line for transmitting inverted output data in order to reduce the influence by noise generated by the output data line. In this case, transition periods of the output data line are noise sources.

Another scheme is known (e.g., Japanese Patent Laid-Open Publications 7-211069 and 2001-167572), in which adjacent signal lines are changed at a regular interval in order to reduce coupling noise capacities between signal lines. This scheme can separate some couples that would make noise due to signal level variations, and can reduce the noise.

Recently the coupling noise has become a serious problem as device sizes become smaller and smaller. FIG. 15 is a graph illustrating an example of noise influence on the output data line IDO shown in FIG. 14. As seen in FIG. 15, a signal on the output data line IDO has coupling noise due to the variation in a signal on the input data line IDI. After closing the selection gate 104, the data on the output data line IDO are maintained by the latch circuit 105 only. Under this condition, when a data element to be written is inputted to the input terminal DI, the level of the input data line IDI changes and then may influence the input data line IDO, which drives the output buffer 106, resulting in further power supply noise.

When a data element to be written is inputted during the data holding period of the latch circuit 105, the output data line IDO may have a coupling noise as explained above. If both signals on the input data line IDI and on the internal control signal line CKL similarly change simultaneously, a signal on the output data line IDO is influenced and may be inverted, and then the data held in the latch circuit 105 may be broken by inversion. Therefore it is desirable to solve this noise problem.

The input signal to the sense amplifier also may be subject to noise influence. For example, in a case where the internal control signal line CKL transmitting a large signal such as an internal synchronization clock signal ICK is disposed in parallel with wiring between the sense amplifier 103 and the column gate 102 as shown in FIG. 12, the potential on the bit line pair BL is varied due to coupling noise. Especially, even if one bit line of the bit line pair BL is influenced by such noise, the sense amplifier 103 may malfunction or be delayed.

In the prior example shown in FIG. 13, similar to FIG. 12, if writing lines such as the output data line IDO or the data line pairs CL receive noise, malfunction may occur. Especially, when a split-word line system is employed, the data line pairs CL have long lengths. If the memory cell array 101 is separated into blocks as discussed in relation to FIG. 13, the sense amplifiers SA0~SAn have to be disposed adjacent to corresponding memory cell blocks. Accordingly, the output data line IDO becomes longer, and therefore a signal transmitted on the output data line IDO becomes more sensitive to a coupling noise.

In the split-word line system, since a plurality of bits are treated as one data element, a plurality of data lines are laid in parallel with each other. Accordingly, a conventional method for shielding the data lines with power supply lines requires a larger layout size. There is another conventional method in which the sense amplifiers do not read out while noise source circuits are operating. There is a further conventional method in which noise source circuits do not operate while data are being read out from the memory cell array. These methods however require additional controlling circuits and may degrade the performance of the semiconductor memory device itself.

Further there is another conventional method in which while data are being read out from the sense amplifiers, clocked inverters employed in the latch circuit 105 are prohibited from operating. In this method, it is necessary to match the inverter's timing with the selection gates and therefore to add a controlling circuit for controlling the timing.

SUMMARY OF THE INVENTION

Accordingly, it is a general object of the present invention to provide a semiconductor memory device that reliably prevents output noise, latch data breaking and output delays due to surrounding circuit noise, without any additional controlling circuit, additional noise prevention layout or degradation of memory circuit performance.

Features and advantages of the present invention are set forth in the description that follows, and in part will become apparent from the description and the accompanying drawings, or may be learned by practice of the invention according to the teachings provided in the description.

Objects as well as other features and advantages of the present invention will be realized and attained by a semiconductor memory device comprising: an input circuit for receiving data to be written into a memory cell array and outputting the received data to write buffer circuits that write the received data into the memory cell array; an output circuit for outputting read data to the outside, each of the read data elements having been read out from the memory cell array and amplified by a corresponding sense amplifiers; an input controller for controlling the input circuit so that the input circuit receives the received data only during a predetermined period; a plurality of input data lines for transmitting the received data from the input circuit to the write buffer circuits; and a plurality of output data lines for transmitting the data amplified by the sense amplifiers to the output circuit; wherein each of the input data lines and each of the output data lines are alternatingly and adjoiningly disposed on the semiconductor memory device.

To achieve these and other advantages and in accordance with the purpose of the invention, as embodied and broadly described herein, the semiconductor memory device may have the following characteristics.

The input controller controls the input circuit so that the input circuit inputs the data to be written in synchronization with a leading edge of an external clock signal.

The input controller generates an internal clock signal based on a predetermined external clock signal; and the input controller controls the input circuit so that the input circuit inputs the data to be written after an external write enable signal becomes an enable state and during a predetermined period since that the internal clock signal has become a predetermined signal level.

The semiconductor memory device further comprises a signal line connected to a power supply or ground, the signal line being disposed outside of the outermost output data line.

The semiconductor memory device further comprises: a complimentary data generator for generating and outputting complimentary data of the data transmitted by each of the input data line; and a plurality of input complementary data lines for transmitting the complementary data from the complimentary data generator to the write buffer circuit; wherein each of the output lines is disposed between the corresponding input line and its corresponding input complementary data line.

The output data lines transmit latched output signals from the sense amplifiers, and the latched output signals are shielded by the input data lines.

In the semiconductor memory device, during a writing operation, the input circuit outputs the received data to the input data lines; and during a reading operation, the output circuit holds data inputted immediately before the reading operation and outputs the inputted data to the input data lines.

The semiconductor memory device further comprises: a plurality of bypass circuits, each of the bypass circuits being disposed between a corresponding input data line and a corresponding output data line, and transmitting the data on the corresponding input data line to the corresponding output data line.

DESCRIPTION OF THE PREFERRED EMBODIMENTS

In the following, embodiments of the present invention are described with reference to the accompanying drawings.

(First Embodiment)

Figure 1:
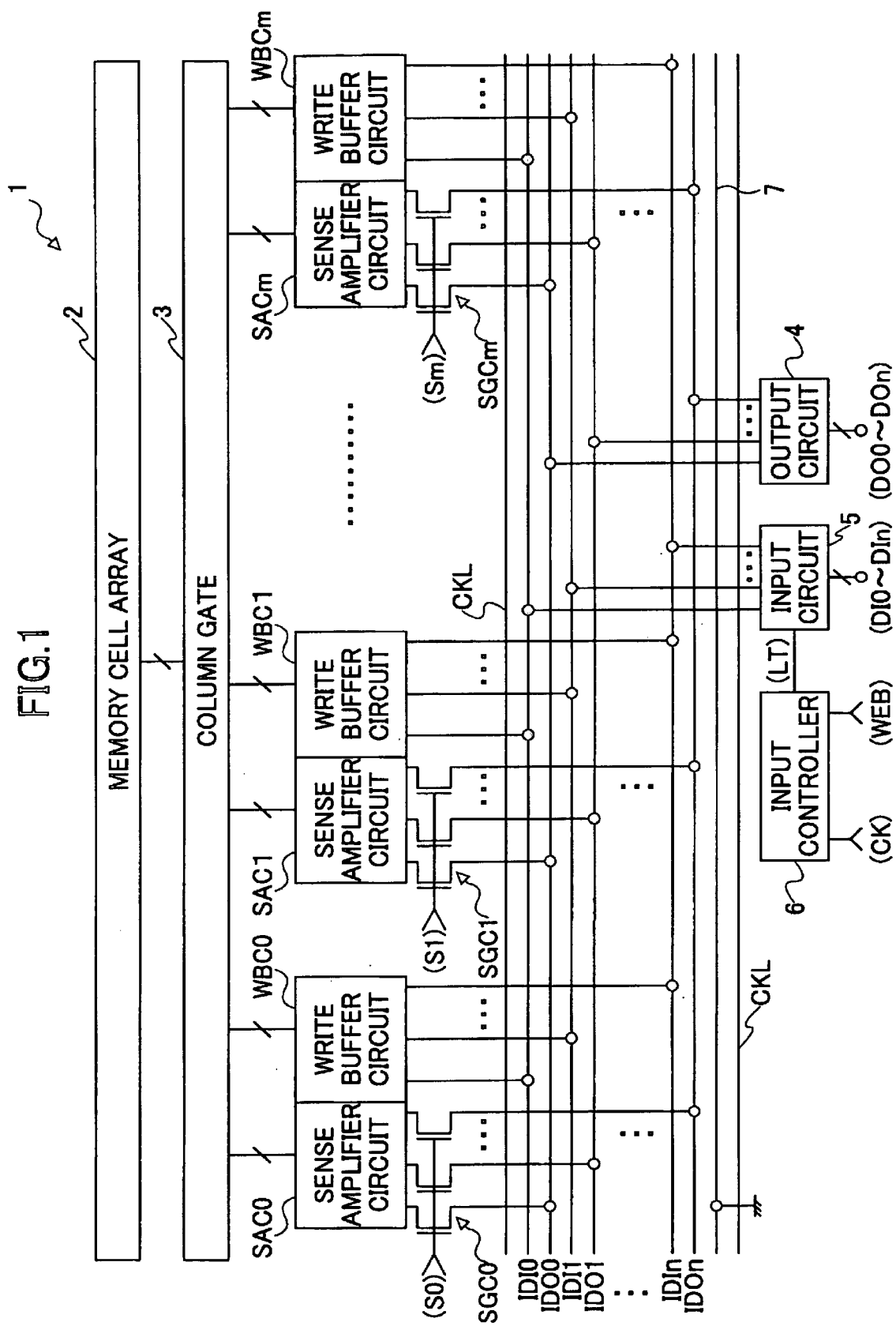
FIG. 1 is a block diagram of a semiconductor memory device according to a first embodiment of the present invention.

FIG. 1 is a block diagram of an example of a semiconductor memory device according to a first embodiment of the present invention. FIG. 1 shows a memory cell array and data input/output portions only and omits an address input portion.

In FIG. 1, a semiconductor memory device 1 is a bit slice type memory device and comprises a memory cell array 2 and a column gate 3. The column gate 3 connects a desired bit line pair extending from the memory cell array 2 to a corresponding one of data line pairs.

The semiconductor memory device 1 further comprises sense amplifier circuits SAC0~SACm (m is a positive integer including zero) that read out and amplify data obtained from the memory cell array 2 via the column gate 3 and the data line pairs, selection gate circuits SGC0~SGCm that control output signals from the sense amplifier circuits SAC0~SACm, and an output circuit 4 that outputs a data signal outputted from one selection gate circuit exclusively selected among the selection gate circuits SGC0~SGCm to a corresponding output terminal DO0~DOn (n is a positive integer including zero).

The semiconductor memory device 1 further comprises an input circuit 5 that sends a data signal inputted through a corresponding input terminal DI0~Din to the memory cell array 2 for writing, and each of write buffer circuits WBC that outputs the data inputted from a corresponding input terminal DI0~Din to write it into the memory cell array 2, and an input controlling circuit 6 for controlling the operation of the input circuit 5 according to a predetermined clock signal CK and a write enable signal WEB.

Each of the sense amplifiers SAC0~SACm is connected to the corresponding output data line IDO0~IDOn via a corresponding gate circuit SDC0~SGCm. Each of the write buffer circuits WBC0~WBCm is connected to the corresponding input data line IDI0~IDIn. The output data lines IDO0~IDOn are connected to the output circuit 4. The input data lines IDI0~IDIn are connected to the input circuit 5. The output data lines IDO0~IDOn and the input data lines IDI0~IDIn are disposed alternatingly and adjoiningly so that the output data lines IDO0~IDOn are shielded with the input data lines IDI0~IDIn. The input data line IDIn and a grounded signal line 7 are disposed one to each side of the output data line IDOn. Further, an internal control signal line CKL transmitting an internal synchronization clock signal ICK is disposed adjacent to the input data line IDI0 and adjacent to the signal line 7.

Figure 2:
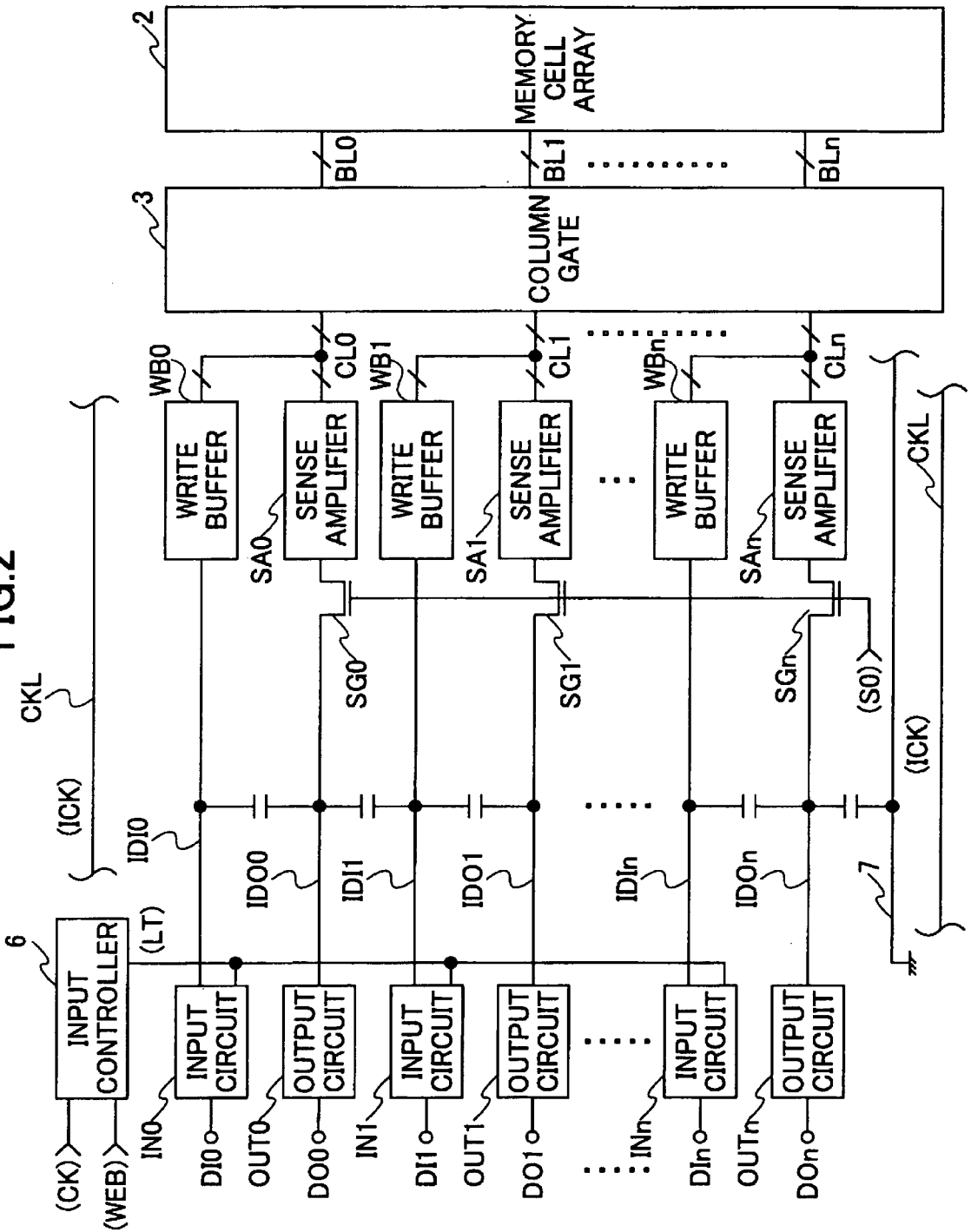
FIG. 2 is a block diagram illustrating in more detail the layout of one sense amplifier circuit, one selection gate circuit, one write buffer circuit, one output circuit and one input circuit shown in FIG. 1.

An example layout of the sense amplifier circuit SAC0, the selection gate circuit SGC0 and the write buffer circuit WBC0 shown in FIG. 1 is illustrated in FIG. 2. FIG. 2 further shows the output circuit 4 and the input circuit 5. The other sense amplifier circuits SAC1~SACm, the other selection gate circuits SGC1~SGCm and the other write buffer circuits WBC1~WBCm shown in FIG. 1 have similar structures and therefore their explanation is omitted.

In FIG. 2, the sense amplifier circuit SAC0 comprises sense amplifiers SA0~SAn, the selection gate circuit SGC0 comprises NMOS transistor selection gates SG0~SGn, and the write buffer circuit WBC0 comprises write buffer WB0~WBn. The output circuit 4 comprises output circuits OUT0~OUTn, and the input circuit 5 comprises input circuits IN0~INn.

Each of the output circuits OUT0~OUTn is connected to a corresponding output terminal DO0~DOn and a corresponding output data line ID0~IDOn. Each of the sense amplifiers SA0~SAn is connected to a corresponding output data line ID0~IDOn via a corresponding selection gate SG0~SGn, and connected through a corresponding data line pair CL0~CLn to a column gate 3. Each of the input circuits IN0~INn is connected to a corresponding input terminal DI0~DIn, and a corresponding data line IDI0~IDIn.

Each of the write buffers WB0~WBn is connected to a corresponding input data line IDI0~IDIn and connected through a corresponding data line pair CL0~CLn to the column gate 3. The write buffers WB0~WBn receive a write enable signal (not shown). The write buffers WB0~WBn output data received from the input data lines IDI0~IDIn to the data line pairs CL0~CLn, respectively, when the write enable signal becomes enabled. The column gate 3 is connected to a memory cell array 2 via bit line pairs BL0~BLn. The input controlling circuit 6 receives an external clock signal CK and a write enable signal WEB, and based on the received signals, provides a control signal LT to the input circuits IN0~INn to control their operations.

Figure 3:
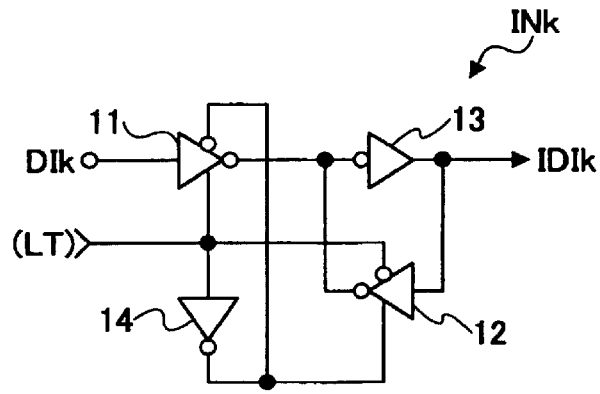
FIG. 3 shows an example of the input circuit of FIG. 2.

FIG. 3 shows an example of the input circuit INk (k=0~n). The other input circuits IN0~INn are all the same and have no need to be shown.

In FIG. 3, the input circuit INk comprises clocked inverters 11, 12 and inverters 13, 14. If a high level control signal LT is inputted from the input controlling circuit 6, the clocked inverter 11 turns ON and the clocked inverter 12 turns OFF. Data inputted from an input terminal DIk is outputted through the clocked inverter 11 and the inverter 13 to an input data line IDIk.

Next, if a low level control signal LT is inputted from the input controlling circuit 6, the clocked inverter 11 turns OFF and the clocked inverter 12 turns ON. The input circuit INk forms a latch circuit by the clocked inverter 12 and the inverter 13. This latch circuit holds an output level that is the output level of the clocked inverter 11 immediately before the clocked inverter 11 turns OFF. In this manner, the input circuit INk stops outputting data received at the input terminal DIk to the input data line IDIk, when the low level control signal LT is inputted.

Figure 4:
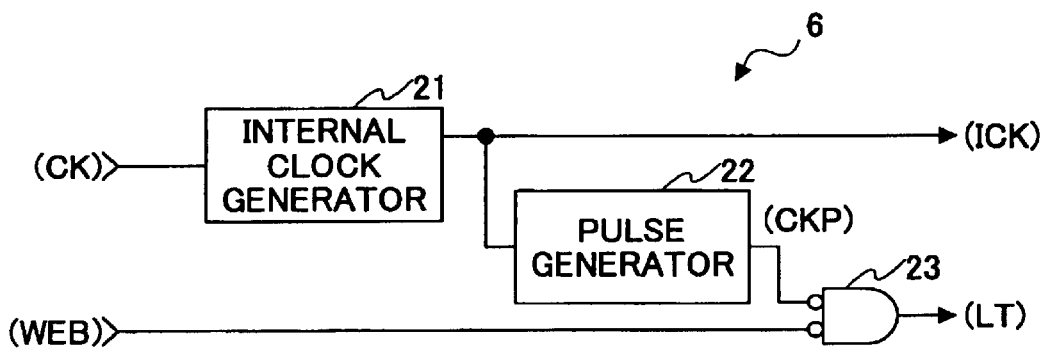
FIG. 4 shows an example of the input controlling circuit of FIG. 2.

FIG. 4 shows an example circuit of the input controlling circuit 6 shown in FIG. 1. In FIG. 4, the input controlling circuit 6 comprises an internal clock generator 21, a pulse generator 22 and a NOR circuit 23. The internal clock generator 21 receives an external clock signal CK and based thereon generates an internal synchronization signal ICK. The pulse generator 22 generates and outputs a low level pulse signal CKP having a predetermined pulse width at a leading edge of the internal synchronization clock signal ICK. The pulse signal CKP is inputted to one input terminal of the NOR circuit 23 and a write enable signal WEB is inputted to the other input terminal of the NOR circuit 23. A control signal LT is outputted from an output terminal of the NOR circuit 23.

Figure 5:
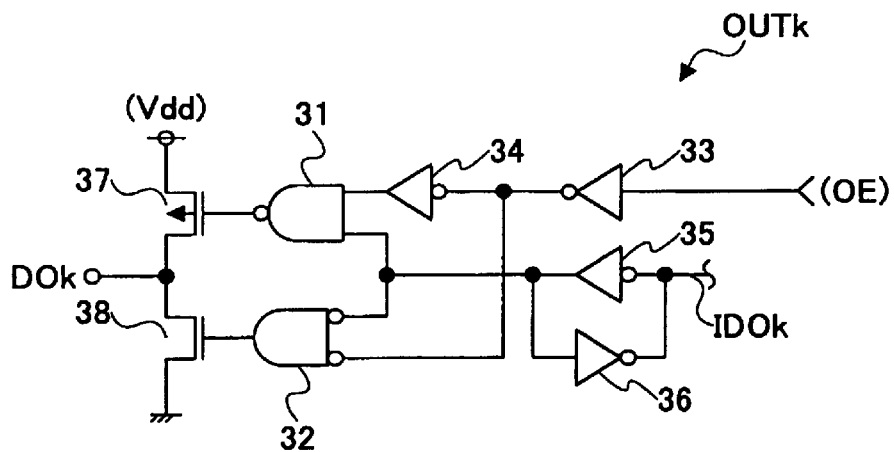
FIG. 5 shows an example of the output circuit of FIG. 2.

FIG. 5 shows an example of the output circuit OUTk (k=0~n). The other output circuits OUT0~OUTn are all the same and have no need to be shown.

In FIG. 5, the output circuit OUTk comprises a NAND circuit 31, a NOR circuit 32, inverters 33~36, a PMOS transistor 37 and an NMOS transistor 38. An external output enable signal OE is inputted via the inverters 33 and 34 to one input terminal of the NAND circuit 31. An output signal of the NAND circuit 31 is inputted to the gate of the PMOS transistor 37.

The PMOS transistor 37 and the NMOS transistor 38 form a push pull circuit connected between a power supply voltage Vdd and ground. A node between the PMOS transistor 37 and the NMOS transistor 38 is connected to an output terminal DOk. The inverters 35 and 36 form a latch circuit, and data inputted from an output data line IDOk are latched in the latch circuit. An output terminal of the inverter 35 as a latch circuit output terminal is connected to the other input terminal of the NAND circuit 31 and one input terminal of the NOR circuit 32. In addition, an output signal of the inverter 33 is inputted to the other input terminal of the NOR circuit 32, and an output terminal of the NOR circuit 32 is connected to the gate of the NMOS transistor 38.

The output circuit OUTk usually receives a high level output enable signal OE. If the output enable signal OE is high, the NAND circuit 31 and the NOR circuit 32 operate the PMOS transistor 37 and the NMOS transistor 38, respectively, according to a signal level of a signal inputted from the output data line IDOk. When the input signal from the output data line IDOk is high, the PMOS transistor 37 turns ON and the NMOS transistor 38 turns OFF, and a high level data signal is outputted from the output terminal DOk. When the input signal from the output data line IDOk is low, the PMOS transistor 37 turns OFF and the NMOS transistor 38 turns ON, and a low level data signal is outputted from the output terminal DOk.

When the output enable signal OE is low, the NAND circuit 31 and the NOR circuit 32 turn the PMOS transistor 37 and the NMOS transistor 38, respectively, OFF to stop outputting the data signal to the output terminal DOk, irrespective of the signal level of the signal inputted from the output data line IDOk.

Figure 6:
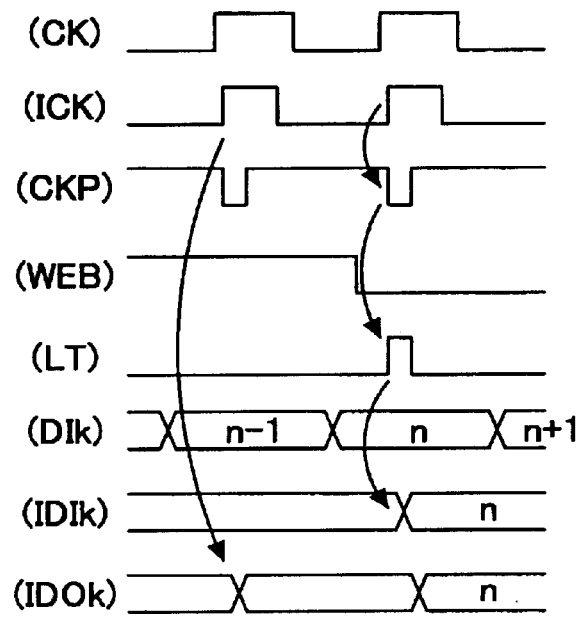
FIG. 6 is a timing chart showing the operations of the input circuit of FIG. 3 and the input controlling circuit of FIG. 4.

FIG. 6 is a timing chart illustrating operations of the input circuit INk shown in FIG. 3 and the input controlling circuit 6 shown in FIG. 4. The operations of the input circuit INk and the input controlling circuit 6 are explained in more detail with reference to FIG. 6.

When the write enable signal WEB is low indicating a write cycle, the NOR circuit 23 outputs a high level control signal LT while the internal synchronization clock signal ICK rises and the pulse signal CKP is low. The input circuit INk outputs data received at the input terminal DIk to the input data line IDIk while the control signal LT is high.

When the write enable signal WEB is high indicating a not-writing cycle or the pulse signal CKP is high, the control signal LT becomes low and the input circuit INk stops outputting the data received at the input terminal DIk to the input data line IDIk. When the write enable signal WEB is high, if the internal synchronization clock signal ICK rises, then the output circuit OUTk outputs data read out from the memory cell array 2 to the output terminal DOk.

In this structure, as explained above, the output data lines IDO0~IDOn and the input data lines IDI0~IDIn are disposed alternatingly and adjacently to each other so that the output data lines IDO0~IDOn are shielded with the input data lines IDI0~IDIn. The input data line IDIn and a grounded signal line 7 are disposed one to each side of the output data line IDOn. Further, an internal control signal line CKL transmitting an internal synchronization clock signal ICK is disposed adjacent to the input data line IDI0 and adjacent to the signal line 7. Parasitic capacitances are formed between the output data lines IDO0~IDOn, the input data lines IDI0~IDIn and the signal 7.

When data are written into the memory cell array 2, the input circuits IN0~INn receive data inputted to the input terminals DI0~DIn. The received data are transmitted through the input data lines IDI0~IDIn, the write buffers WB0~WBn, the data line pairs CL0~CLn, the column gate 3 and the bit line pairs BL0~BLn to the memory cell array 2.

Next, when data are read out from the memory cell array 2, data from a selected memory cell in the memory cell array 2 are inputted through a corresponding bit line pair BL0~BLn to the column gate 3, and transmitted via a corresponding data line pair CL0~CLn to a corresponding sense amplifier SA0~SAn. The sense amplifier SA0~SAn amplifies and outputs the inputted data signal. The outputted signal is transmitted to a corresponding output circuit OUT0~OUTn via a corresponding selection gate SG0~SGn and a corresponding output data line IDO0~IDOn. The data inputted to the output circuit OUT0~OUTn are outputted to the outside via a corresponding output terminal DO0~DOn.

The input controlling circuit 6 is used for limiting the input data acquisition period. The input controlling circuit 6 determines whether the write cycle is enabled based on the write enable signal WEB. The input controlling circuit 6 allows the input circuits IN0~INn to acquire data from the input terminals DI0~DIn only during a certain period since detecting the write cycle. The input data lines IDI0~IDIn and the output data lines IDO0~IDOn are disposed alternatingly and adjacently to each other.

Generally, if the input data line is disposed adjacent to the output data line, the output data line is subject to coupling noise. However, since the input controlling circuit 6 limits the inputting operation of the input circuit IN0~INn within a certain period in a write cycle, the input data lines IDI0~IDIn do not influence the output data lines IDO0~IDOn while the output data lines are reading out or holding data. While the operation of the input circuit IN0~INn is stopped by the input controlling circuit 6, signal levels on the input data line IDI0~IDIn do not vary and are stable at the preceding levels. Therefore, the input data lines IDI0~IDIn have a shielding effect that prevents noise from coming from other signals.

While acquiring data in a write cycle, the input circuits IN0~INn operate and transmit data to be written onto the input data lines IDI0~IDIn. At that time, the signals on the input data lines IDI0~IDIn are transmitted via the sense amplifiers SA0~SAn to the output data lines IDO0~IDOn, respectively, causing no problem.

During a write cycle, the sense amplifiers SA0~SAn read data provided by the write buffers WB0~WBn instead of using small potential differences outputted from the memory cell array 2, and therefore the operation is stable.

Since both signals on the input data lines IDI0~IDIn and the output data lines IDO0~IDOn move in the same potential direction, they are not badly affected by coupling noise. Even if neighboring data lines have different (bit opposite) data, coupling noise is cancelled and no bad influence occurs.

In the layout of the semiconductor memory device 1, many internal control signal lines CKL are disposed everywhere. In the prior art, the internal control signal lines CKL give noise to the output data lines IDO0~IDOn. In the first embodiment semiconductor memory device, however, all the output data lines IDO0~IDOn are shielded by the input data lines IDI0~IDIn, and therefore the output data lines IDO0~IDOn are not subject to noise from the internal control signal lines CKL.

Figure 7:
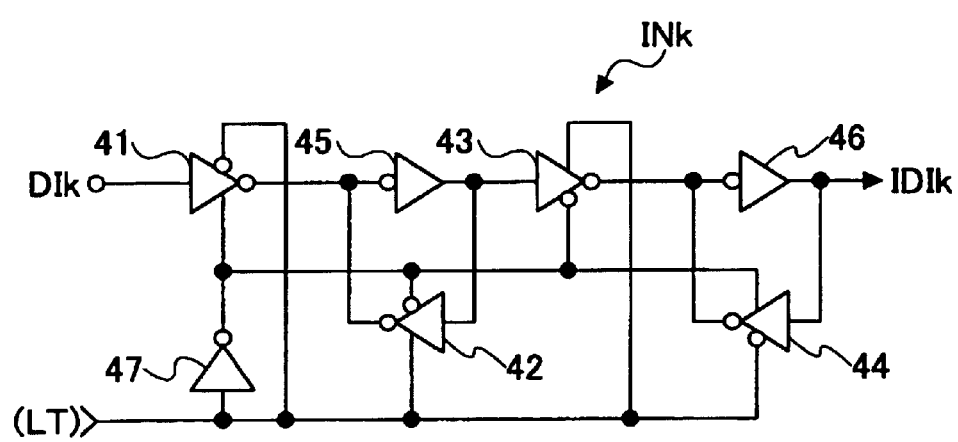
FIG. 7 shows another example of the input circuit of FIG. 2.
Figure 8:
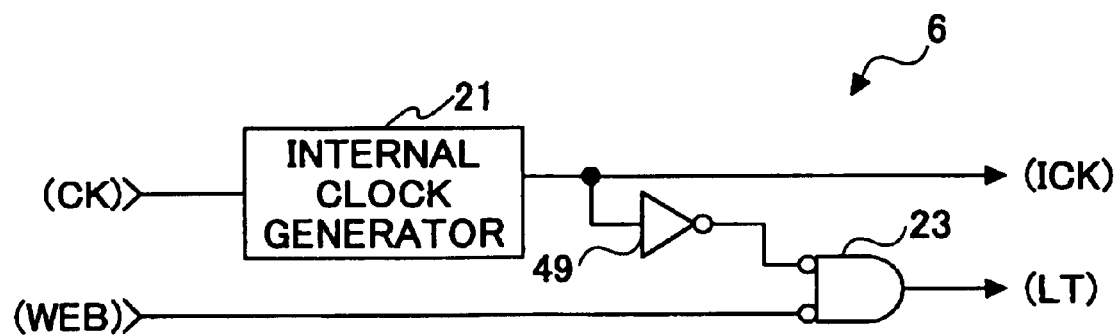
FIG. 8 shows another example of the input controlling circuit of FIG. 2.

The input circuit INk in FIG. 3 may employ a flip flop. If so, the input circuit INk becomes a circuit as shown in FIG. 7, for example, and the input controlling circuit 6 of FIG. 4 may become a circuit as shown in FIG. 8. In FIG. 8, parts the same as or similar to those in FIG. 4 are assigned the same reference numbers as in FIG. 4.

In FIG. 7, the input circuit INk comprises clocked inverters 41~44, and inverters 45~47.

When a high level control signal LT is inputted from the input controlling circuit 6, the clocked inverters 41, 44 turn OFF and the clocked inverter 42, 43 turn ON, and the clocked inverter 42 and the inverter 45 form a latch circuit. The latch circuit maintains an output level of the clocked inverter 41 immediately before the clocked inverter 41 turns OFF. The maintained data element is outputted via the clocked inverter 43 and the inverter 46 to the input data line IDIk.

Next, when a low level control signal LT is inputted from the input controlling circuit 6, the clocked inverters 41, 44 turn ON and the clocked inverter 42, 43 turn OFF, and the clocked inverter 44 and the inverter 46 form a latch circuit. The latch circuit maintains an output level of the clocked inverter 43 immediately before the clocked inverter 43 turns OFF. The maintained data element is outputted to the input data line IDIk. In this manner, if the low level control signal LT is inputted, the input circuit INk stops outputting the data received at the input terminal DIk to input data line IDIk.

With reference to FIG. 8, the input controlling circuit 6 comprises an internal clock generator 21, a NOR circuit 23, and an inverter 49. To one input terminal of the NOR circuit 23 is inputted an inverted signal that is obtained by inverting an internal synchronization signal ICK by an inverter 49. To the other input terminal of the NOR circuit 23 is inputted a write enable signal WEB. A control signal LT is outputted from the output terminal of the NOR circuit 23.

Figure 9:
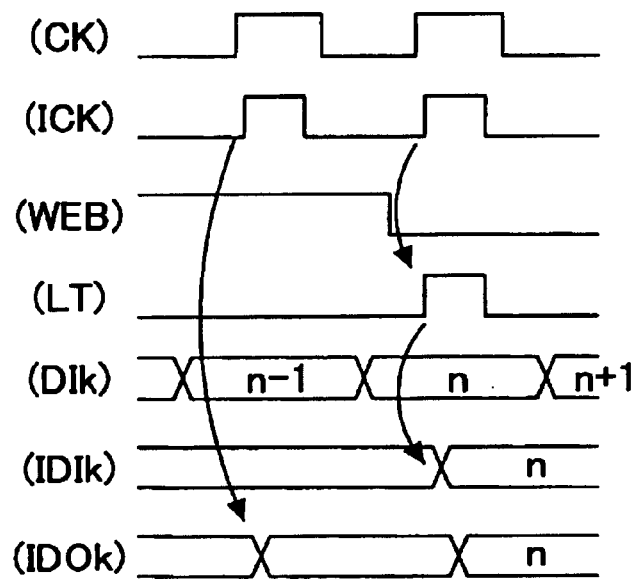
FIG. 9 is a timing chart showing the operations of the input circuit of FIG. 7 and the input controlling circuit of FIG. 8.

FIG. 9 is a timing chart illustrating the operations of the input circuit INk shown in FIG. 7 and the input controlling circuit 6 shown in FIG. 8. The operations of the input circuit INk and the input controlling circuit 6 are explained in more detail with reference to FIG. 9.

When the write enable signal WEB is low indicating a write cycle, the NOR circuit 23 outputs a high level control signal LT while the internal synchronization clock signal ICK rises. The input circuit INk outputs data received at the input terminal DIk and latched by the clocked inverter 42 and the inverter 45 to the input data line IDIk while the control signal LT is high.

When the write enable signal WEB is high indicating a not-writing cycle, the control signal LT becomes low and the input circuit INk stops outputting the data received at the input terminal DIk to the input data line IDIk. When the write enable signal WEB is high, if the internal synchronization clock signal ICK rises, then the output circuit OUTk outputs data read out from the memory cell array 2 to the output terminal DOk.

Figure 10:
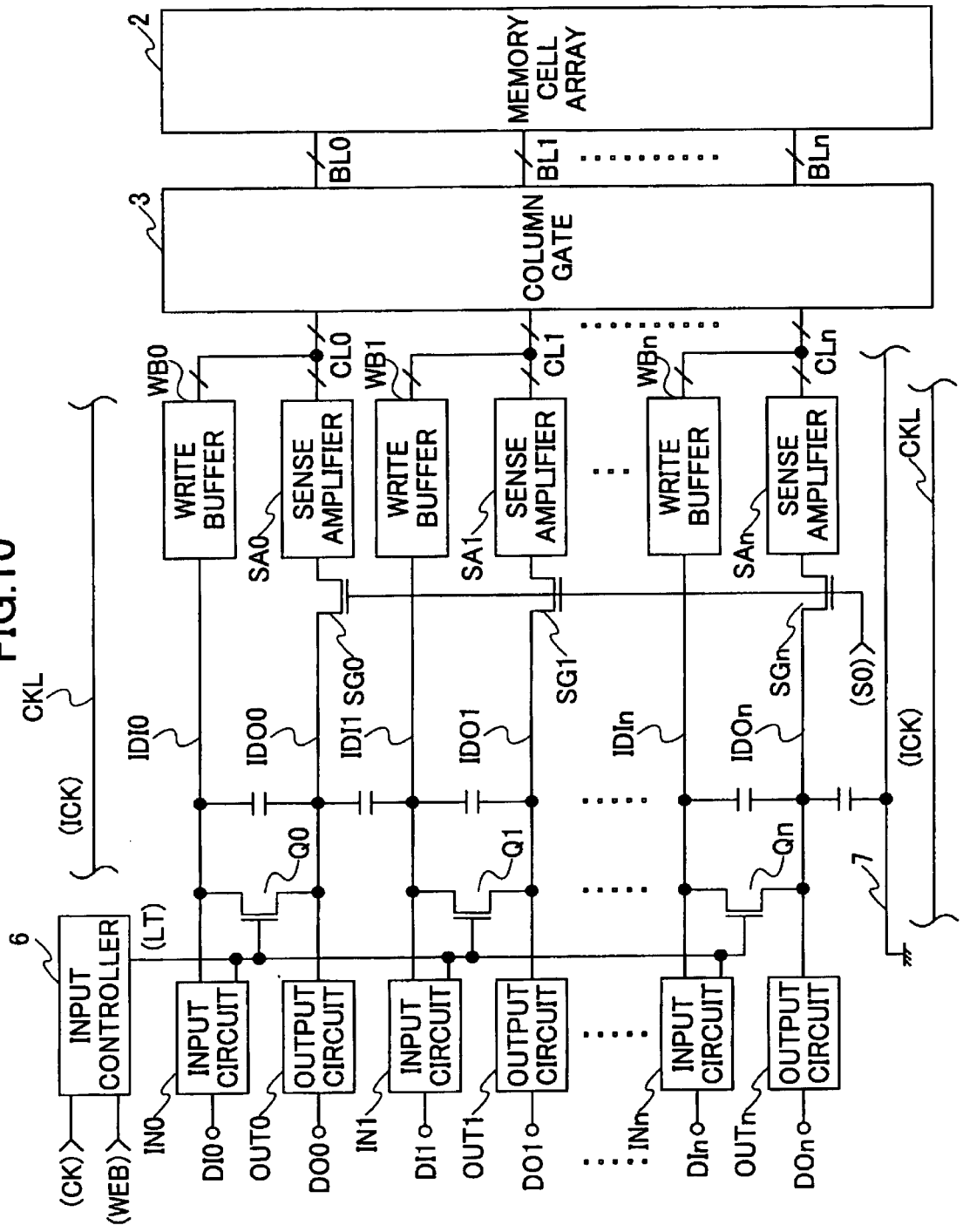
FIG. 10 is a block diagram of another example of a semiconductor memory device according to the first embodiment of the present invention.

FIG. 10 is similar to FIG. 2, but different in that between the input data lines IDI0~IDIn and the output data lines IDO0~IDOn, are inserted NMOS transistors Q0~Qn, to gates of which control signals LT are inputted. During a write cycle, in order to output data to be written from the output terminals DO0~DOn, the sense amplifiers SA0~SAn transmit data received at the input terminal DI0~DIn to the output data terminal DO0~DOn via the output data lines IDO0~IDOn. Since the NMOS transistors Q0~Qn form bypasses between the input data lines IDI0~IDIn and the output data lines IDO0~IDOn, data of the output data lines IDO0~IDOn are prevented from becoming unstable at the initial period of the writing cycle. There is no need to pass through the sense amplifiers SA0~SAn, and therefore the operation of the sense amplifiers SA0~SAn can be stopped to reduce current consumption.

In the semiconductor memory device according to the first embodiment of the present invention, the output data lines IDO0~IDOn are shielded by the input data lines IDI0~IDIn connected to the input circuits IN0~INn, the operations of which are limited only during a certain period in a write cycle by the input controlling circuit 6. Therefore coupling noise influences can be easily reduced without providing additional layout or controlling circuit or shielding the output data lines by power supply wiring, resulting in small circuit devices having high noise tolerance.

(Second Embodiment)

Since complementary signals are transmitted on the bit line pairs BL0~BLn connecting to the memory cell array 2 for inputting/outputting, it is necessary to generate inverted signals of data signals inputted to the input terminals. This inversion can be done immediately after the input circuits IN0~INn in a second embodiment of the present invention.

Figure 11:
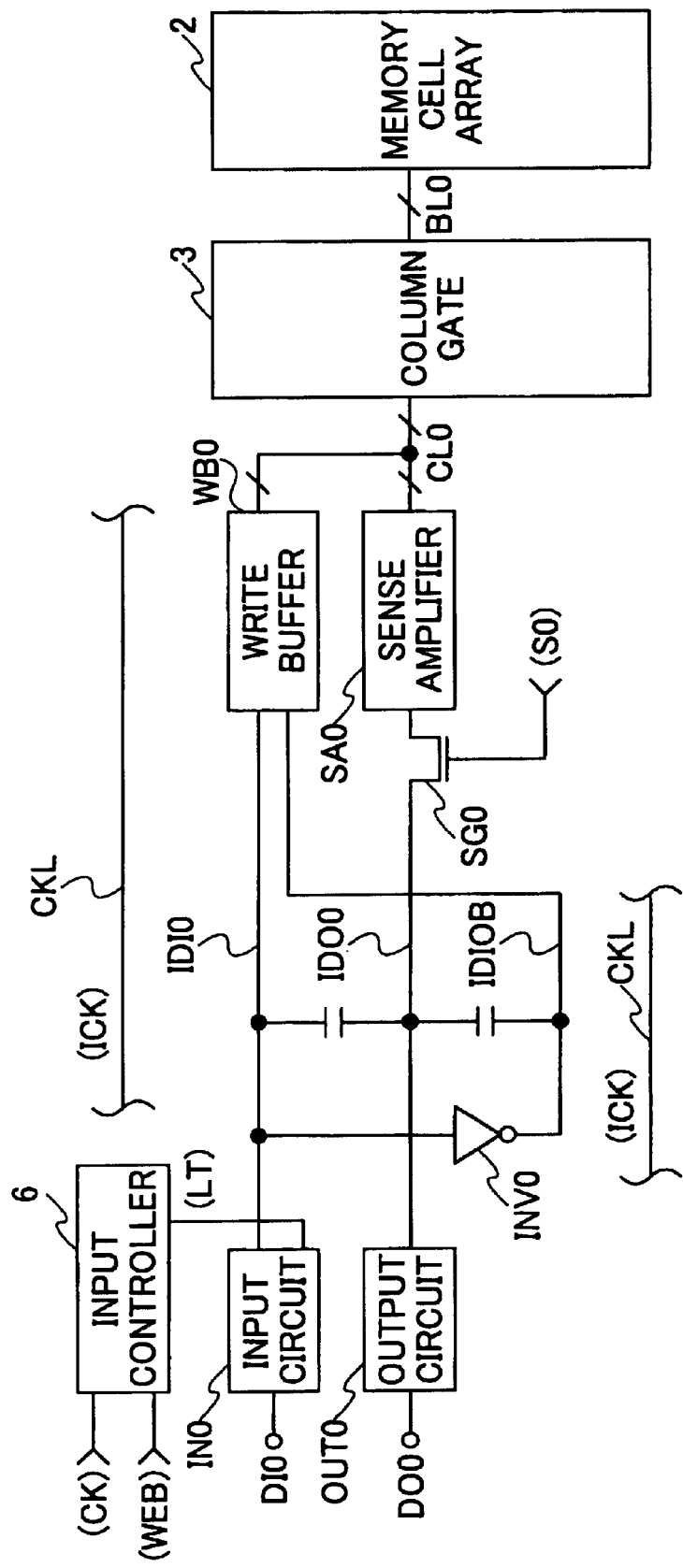
FIG. 11 is a block diagram of a semiconductor memory device according to a second embodiment of the present invention.
Figure 12:
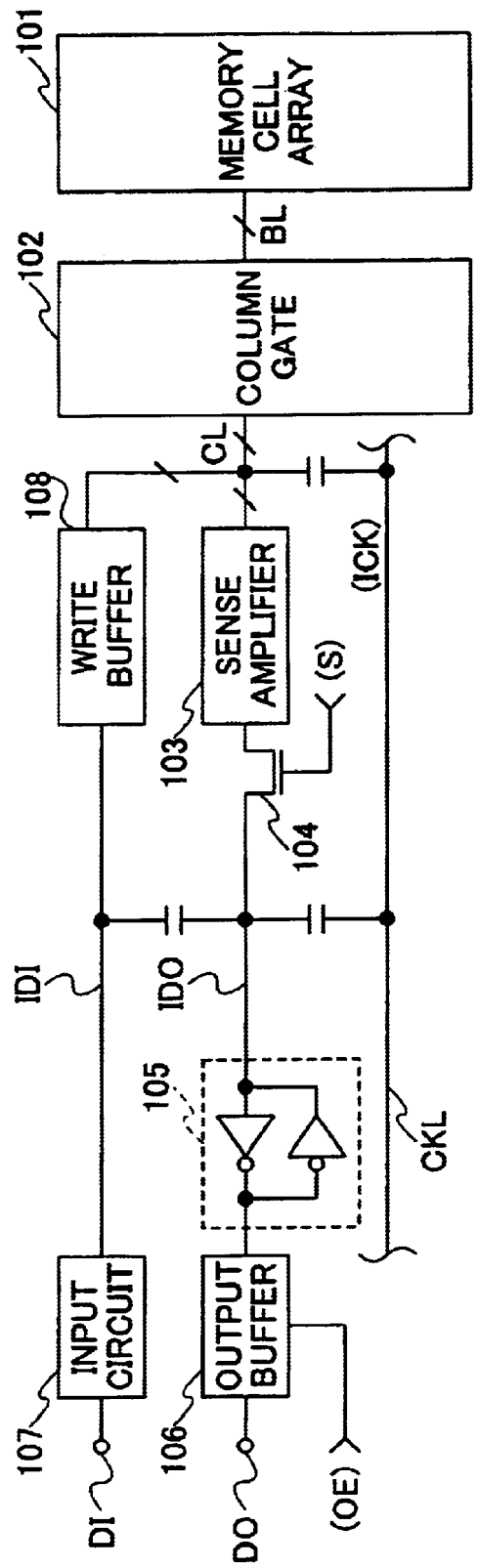
FIG. 12 is a block diagram of a conventional semiconductor memory device.
Figure 13:
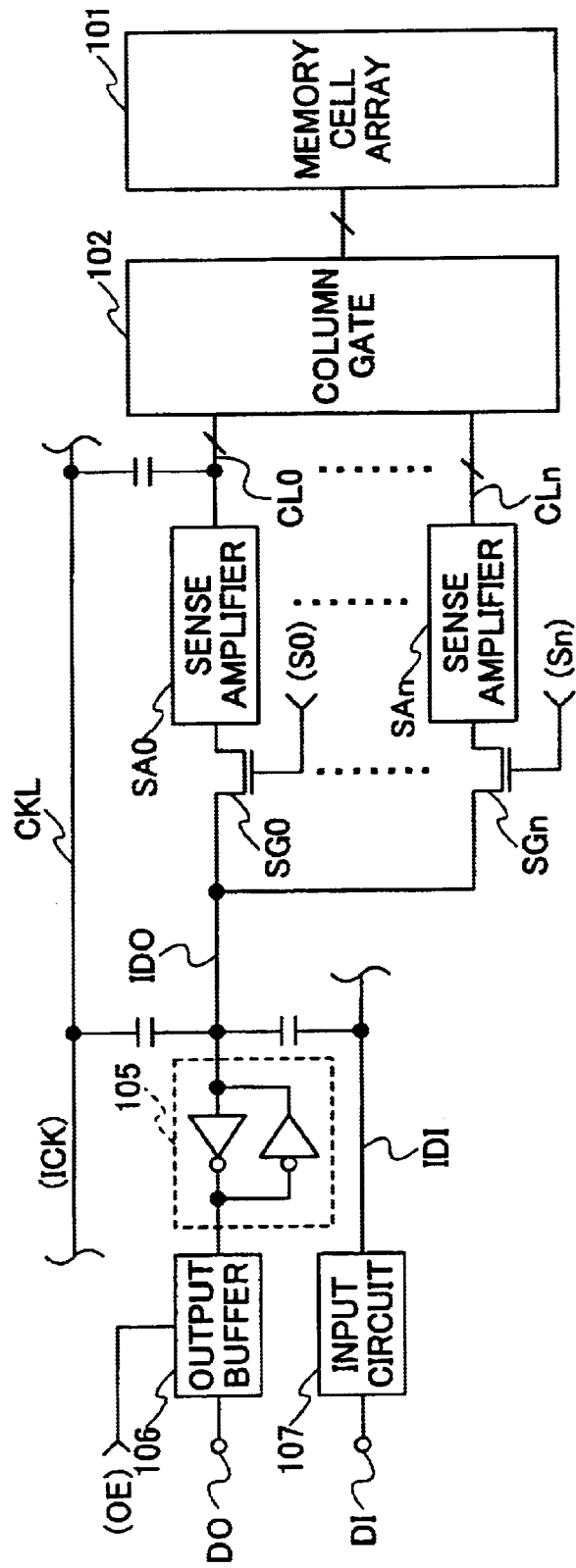
FIG. 13 is a block diagram of another conventional semiconductor memory device.
Figure 14:
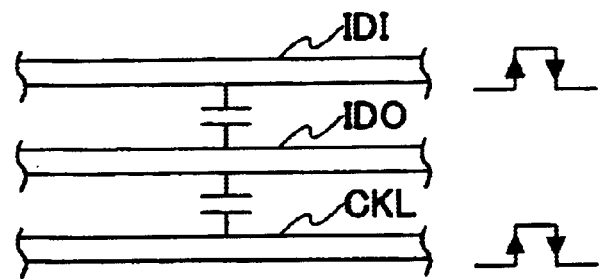
FIG. 14 shows a conventional line layout in which an internal controlling signal line CKL is disposed adjacent to an output data line IDO.
Figure 15:
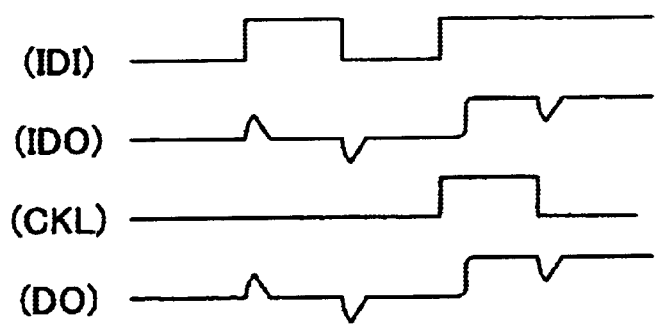
FIG. 15 a graph showing noise influence on the output data line IDO disposed as in FIG. 14.

FIG. 11 is a block diagram of a semiconductor memory device according to the second embodiment of the present invention. Parts shown in FIG. 11 the same as or similar to those in FIG. 2 are assigned the same reference numbers and their explanations are omitted. Only the differences from FIG. 2 are explained below. FIG. 11 only shows an example where n=0. Other examples other than n=0 are similar and their explanations are omitted.

FIG. 11 is different from FIG. 2 in that an input data line IDI0B is provided corresponding to the input data line IDI0 to form an input data line pair, the input data line pair IDI0 and IDI0B being disposed one on each side of output data line IDO0 to shield the output data line IDO0 in FIG. 11. Further, a signal obtained by inverting a data signal from the input circuit IN0 by an inverter INV0 as a complementary signal generator is outputted onto the input data line IDI0B.

As explained above, the output data line IDO0 is shielded by being accompanied by the input data lines IDI0 and IDI0B one on either side thereof. Further, outside and adjacent to each of the input data lines IDI0 and IDI0B, is disposed an input control signal line CKL transmitting internal synchronization signal ICK. Parasitic capacities are established between the output data line IDO0 and the input data lines IDI0~IDI0B. In this manner, the input data line IDI0B transmits the inverted signal of a signal transmitted on the input data line IDI0, and therefore the output data line IDO0 can be shielded by the input data lines IDI0 and IDI0B to reduce noise on the output data line IDO0.

In the semiconductor memory device according to the second embodiment of the present invention, the output data line IDO0 is disposed between the input data line pair IDI0, IDI0B, which transmit complementary signals in order to shield the output data line IDO0. In this way, in the second embodiment, an advantage is attained similar to the first embodiment, and the inverted signal of the data signal inputted from the input terminal can be easily generated and transmitted to the write buffer.

In the first and second embodiments above, explanations are given regarding noise to the output data lines holding data to be read out. However, noise to data line pairs connected to the sense amplifiers can be prevented by similar means. The data line pairs transmitting complementary signals are disposed between the input data lines in order to reduce noise to the data line pairs during data reading periods and prevent sense amplifier malfunction and delayed data output.

As clearly seen from the explanation above, in semiconductor memory devices according to the present invention, output data lines sensitive to noise are shielded by input data lines, the signal transmission operations of which are limited only during a certain period in the write cycle. Therefore coupling noise influences can be easily reduced without providing additional layout or controlling circuit, resulting in small circuit devices having high noise tolerance.

Further, the present invention is not limited to these embodiments, but various variations and modifications may be made without departing from the scope of the present invention.

The present application is based on Japanese Priority Application No. 2003-036535 filed on Feb. 14, 2003 with the Japanese Patent Office, the entire contents of which are hereby incorporated by reference.

What is claimed is:

1. A semiconductor memory device comprising:
   an input circuit for receiving data to be written into a memory cell array and outputting the received data to write buffer circuits that write the received data into the memory cell array;
   an output circuit for outputting read data to the outside, each element of the read data having been read out from the memory cell array and amplified by a corresponding sense amplifier;
   an input controller for controlling the input circuit so that the input circuit receives the received data only during a predetermined period;
   a plurality of input data lines for transmitting the received data from the input circuit to the write buffer circuits; and
   a plurality of output data lines for transmitting the data amplified by the sense amplifiers to the output circuit;
   wherein the input data lines and the output data lines are alternatingly and adjoiningly disposed on the semiconductor memory device.

2. The semiconductor memory device as claimed in claim 1, wherein the input controller controls the input circuit so that the input circuit inputs the data to be written in synchronization with a leading edge of an external clock signal.

3. The semiconductor memory device as claimed in claim 2, wherein the input controller generates an internal clock signal based on a predetermined external clock signal; and
   the input controller controls the input circuit so that the input circuit inputs the data to be written after an external write enable signal becomes an enable state and during a predetermined period since the internal clock signal has become a predetermined signal level.

4. The semiconductor memory device as claimed in claim 1, further comprising a signal line connected to a power supply or ground, the signal line being disposed outside of the outermost output data line.

5. The semiconductor memory device as claimed in claim 1, further comprising:
   a complimentary data generator for generating and outputting complimentary data of the data transmitted by each of the input data lines; and
   a plurality of input complementary data lines for transmitting the complementary data from the complimentary data generator to the write buffer circuit;
   wherein each of the output data lines is disposed between the corresponding input data line and its corresponding input complementary data line.

6. The semiconductor memory device as claimed in claim 1, wherein the output data lines transmit latched output signals from the sense amplifiers, and the latched output signals are shielded by the input data lines.

7. The semiconductor memory device as claimed in claim 1, wherein,
   during a writing operation, the input circuit outputs the received data to the input data lines; and
   during a reading operation, the output circuit holds data inputted immediately before the reading operation and outputs the inputted data to the input data lines.

8. The semiconductor memory device as claimed in claim 1, further comprising:
   a plurality of bypass circuits, each of the bypass circuits being disposed between a corresponding input data line and a corresponding output data line, and transmitting the data on the corresponding input data line to the corresponding output data line.

* * * * *